United States Patent
Teh

(10) Patent No.: US 10,282,109 B1
(45) Date of Patent: May 7, 2019

(54) MEMORY INTERFACE CIRCUITRY WITH DISTRIBUTED DATA REORDERING CAPABILITIES

(71) Applicant: Altera Corporation, San Jose, CA (US)

(72) Inventor: Chee Hak Teh, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 55 days.

(21) Appl. No.: 15/266,646

(22) Filed: Sep. 15, 2016

(51) Int. Cl.
*G06F 3/06* (2006.01)
*G11C 7/10* (2006.01)

(52) U.S. Cl.
CPC .......... *G06F 3/0611* (2013.01); *G06F 3/0658* (2013.01); *G06F 3/0659* (2013.01); *G06F 3/0673* (2013.01); *G11C 7/1012* (2013.01)

(58) Field of Classification Search
CPC .......... G06F 3/06–3/061; G06F 3/0611; G06F 3/0613–3/0658; G06F 3/0659–3/0671; G06F 3/0673–3/0689; G06F 13/00–13/4295; G06F 2212/00–2212/7211; G11C 7/00–7/1012; G11C 7/1015–7/1096; G11C 2207/00–2207/229
See application file for complete search history.

(56) References Cited

U.S. PATENT DOCUMENTS

| | | | | | |
|---|---|---|---|---|---|
| 5,465,336 | A | * | 11/1995 | Imai | G06F 9/3834 711/167 |
| 5,517,648 | A | * | 5/1996 | Bertone | G06F 12/0831 710/244 |
| 5,611,058 | A | * | 3/1997 | Moore | G06F 12/0831 710/114 |
| 5,805,470 | A | * | 9/1998 | Averill | G06F 17/5022 703/27 |
| 5,809,340 | A | * | 9/1998 | Bertone | G06F 12/0831 709/233 |

(Continued)

OTHER PUBLICATIONS

The heterogeneous block architecture; Fallin et al.; IEEE 32nd International Conference on Computer Design; Oct. 19-22, 2014 (Year: 2014).*

(Continued)

*Primary Examiner* — Daniel C. Chappell
(74) *Attorney, Agent, or Firm* — Treyz Law Group, P.C.; Jason Tsai

(57) ABSTRACT

An integrated circuit may include memory interface circuitry for communicating with an external or in-package memory module. The integrated circuit may also include out-of-order (OOO) clients and in-order (IO) clients that issue read and write commands to the memory interface circuitry. The memory interface circuitry may include a memory controller having an OOO command scheduler, a write data buffer, and a simple read data pipeline. The memory interface circuitry may also include a multiport arbitration circuit for interfacing with the multiple clients and also OOO adaptor circuits interposed between the multiport arbitration circuit and the IO clients. Each of the OOO adaptor circuits may include an ID generator and a local reordering buffer and may allow the memory controller to return data to the various clients without throttling.

20 Claims, 6 Drawing Sheets

(56) References Cited

U.S. PATENT DOCUMENTS

| | | | | |
|---|---|---|---|---|
| 5,835,741 A * | 11/1998 | Elkhoury | G06F 13/4027 | 710/310 |
| 5,926,840 A * | 7/1999 | Gold | G06F 13/1626 | 711/156 |
| 6,108,741 A * | 8/2000 | MacLaren | G06F 13/4036 | 710/108 |
| 6,237,066 B1 * | 5/2001 | Pan | G06F 9/3824 | 710/39 |
| 6,304,936 B1 * | 10/2001 | Sherlock | G06F 13/4022 | 370/412 |
| 6,308,257 B1 * | 10/2001 | Theogarajan | G06F 9/30145 | 711/209 |
| 6,484,240 B1 * | 11/2002 | Cypher | G06F 12/0831 | 711/141 |
| 6,510,474 B1 * | 1/2003 | Stracovsky | G06F 12/0215 | 710/116 |
| 6,609,192 B1 * | 8/2003 | Guthrie | G06F 9/30087 | 712/216 |
| 6,687,240 B1 * | 2/2004 | Moertl | G06F 13/4036 | 370/351 |
| 6,853,382 B1 * | 2/2005 | Van Dyke | G06F 13/161 | 345/502 |
| 6,868,469 B2 * | 3/2005 | Bennett | G06F 13/4031 | 710/306 |
| 6,871,273 B1 * | 3/2005 | Moore | G06F 9/30043 | 712/207 |
| 7,043,593 B1 * | 5/2006 | Tischler | G06F 13/161 | 710/306 |
| 7,409,516 B2 * | 8/2008 | Teh | G06F 13/1668 | 711/105 |
| 8,032,734 B2 * | 10/2011 | Svendsen | G06F 9/30094 | 712/216 |
| 8,694,584 B2 | 4/2014 | Chan et al. | | |
| 8,930,641 B1 * | 1/2015 | Kapasi | G06F 13/28 | 711/149 |
| 9,298,632 B2 * | 3/2016 | Chappell | G06F 12/0842 | |
| 9,378,043 B1 * | 6/2016 | Zhang | G06F 9/45558 | |
| 9,384,793 B2 * | 7/2016 | Gaertner | G11C 7/1012 | |
| 9,477,586 B1 * | 10/2016 | Hedinger | G06F 12/00 | |
| 9,852,109 B2 * | 12/2017 | Ramanujam | G06F 15/82 | |
| 2002/0194444 A1 * | 12/2002 | Goodrich, II | G06F 13/1626 | 711/167 |
| 2003/0093630 A1 * | 5/2003 | Richard | G06F 13/1626 | 711/154 |
| 2003/0110350 A1 * | 6/2003 | McGee | G06F 13/1642 | 711/108 |
| 2003/0233503 A1 * | 12/2003 | Yang | G06F 13/1663 | 710/100 |
| 2004/0044796 A1 * | 3/2004 | Vangal | H04L 69/16 | 709/250 |
| 2008/0259960 A1 * | 10/2008 | Favor | H04L 49/90 | 370/476 |
| 2011/0185102 A1 * | 7/2011 | Deogharia | G06F 13/4059 | 710/309 |
| 2011/0280312 A1 * | 11/2011 | Gaur | H04N 19/61 | 375/240.25 |
| 2011/0320523 A1 | 12/2011 | Chan et al. | | |
| 2012/0239873 A1 * | 9/2012 | Huang | G06F 13/1626 | 711/105 |
| 2014/0052905 A1 * | 2/2014 | Lih | G06F 12/0831 | 711/105 |
| 2014/0281402 A1 * | 9/2014 | Comparan | G06F 9/30189 | 712/214 |
| 2015/0095625 A1 * | 4/2015 | Hassanein | G06F 9/30181 | 712/226 |
| 2015/0277914 A1 * | 10/2015 | Kelm | G06F 9/52 | 712/226 |
| 2015/0296018 A1 * | 10/2015 | Dondini | G06F 13/4022 | 709/213 |
| 2017/0357512 A1 * | 12/2017 | Landers | G06F 9/3836 | |

OTHER PUBLICATIONS

Scheduling heterogeneous multi-cores through performance impact estimation (PIE); Craeynest et al.; 39th Annual International Symposium on Computer Architecture; Jul. 9-13, 2012 (Year: 2012).*

Phase-Guided Scheduling on Single-ISA Heterogeneous Multicore Processors; Sawalha et al.; 14th Euromicro Conference on Digital System Design; Aug. 31, 2011-Sep. 2, 2011 (Year: 2011).*

* cited by examiner

MEMORY INTERFACE CIRCUITRY WITH DISTRIBUTED DATA REORDERING CAPABILITIES

BACKGROUND

In a typical system, an integrated circuit, memory devices, and other electronic components are mounted on a printed circuit board. The integrated circuit includes memory interface circuitry that is used to relay data back and forth between the integrated circuit and the memory devices (i.e., the memory interface circuitry is used to read data from and write data into the memory devices).

In general, the memory interface circuitry can be implemented as either an "in-order" or an "out-of-order" memory controller. In-order memory controllers process memory access requests in order and offer determinism on memory scheduling but often lack scheduling efficiency in terms of memory bandwidth utilization. Out-of-order memory controllers can process access requests out of order and can offer improved memory bandwidth utilization but the scheduling is non-deterministic.

Certain systems may, however, include a mixture of different types of clients on an integrated circuit. For example, the integrated circuit may include a first portion of clients which are capable of out-of-order data return and a second portion of clients which can only handle in-order data return. In such types of systems, the memory controller will always need to reorder the data before returning it to satisfy the needs of the in-order clients. By always performing data reordering at the memory controller, the improved efficiency of out-of-order clients is effectively eliminated due to the presence of the in-order clients. This results in an inefficient memory system with sub-optimal latency, higher power consumption, and increased cost due to circuitry that is needed to support data reordering for each and every client at the memory controller.

It is within this context that the embodiments described herein arise.

SUMMARY

An integrated circuit die that includes memory interface circuitry for communicating with external memory is provided. The integrated circuit may include at least a first client of a first scheduling type (e.g., an out-of-order client) and a second client of a second scheduling type (e.g., an in-order client). The memory interface circuitry may include a memory controller, a multi-port arbitration circuit that is coupled between the memory controller and the clients, and an out-of-order (OOO) adaptor circuit that is coupled between only the second client and the multi-port arbitration circuit. The memory controller may include an OOO command scheduler, a write data buffer, and a read data pipeline that does not perform any read data reordering.

While the first client may include an internal data buffer that is capable of reordering read data, the second client does not have any internal data reordering capabilities. As such, the OOO adaptor may serve to perform read data reordering locally for the second client. The OOO adaptor may include a command identification (ID) generator and a reorder buffer. The ID generator may be an incrementing circuit that outputs increasing command ID tags. The reorder buffer may receive read data and a read ID tag for addressing/decoding the reorder buffer. The reorder buffer may have a first portion for storing the read data and a second perform for storing a read valid flag. The reorder buffer may only output read data when a head-of-queue point is pointing to an entry in the reorder buffer with an asserted read valid flag.

In general, the integrated circuit may include any number of OOO clients and any number of IO clients. An out-of-order adaptor circuit may be inserted between each of the IO clients and the multi-port arbitration circuit. If desired, the reorder buffers in the OOO adaptors may have different buffer sizes. Moreover, the internal data buffers in the OOO clients may also have different storage capacities than the reorder buffers within the OOO adaptors.

Further features of the invention, its nature and various advantages will be more apparent from the accompanying drawings and following detailed description.

DETAILED DESCRIPTION

Embodiments of the present invention relate to integrated circuits that contain memory interface circuitry.

In accordance with an embodiment, an integrated circuit may include memory controllers that can be used to support both out-of-order (OOO) command scheduling for OOO clients and also in-order (IO) command scheduling for IO clients. In particular, the memory interface circuitry may include a memory controller without any data reordering circuit but rather includes distributed out-of-order adaptor circuits interposed between the memory controller and each respective IO client. The distributed out-of-order adaptors help to handle data reordering locally for each IO client and effectively negates the need for the memory controller to reorder the read data prior to returning it to the requesting clients.

It will be recognized by one skilled in the art, that the present exemplary embodiments may be practiced without some or all of these specific details. In other instances, well-known operations have not been described in detail in order not to unnecessarily obscure the present embodiments.

Figure 1:
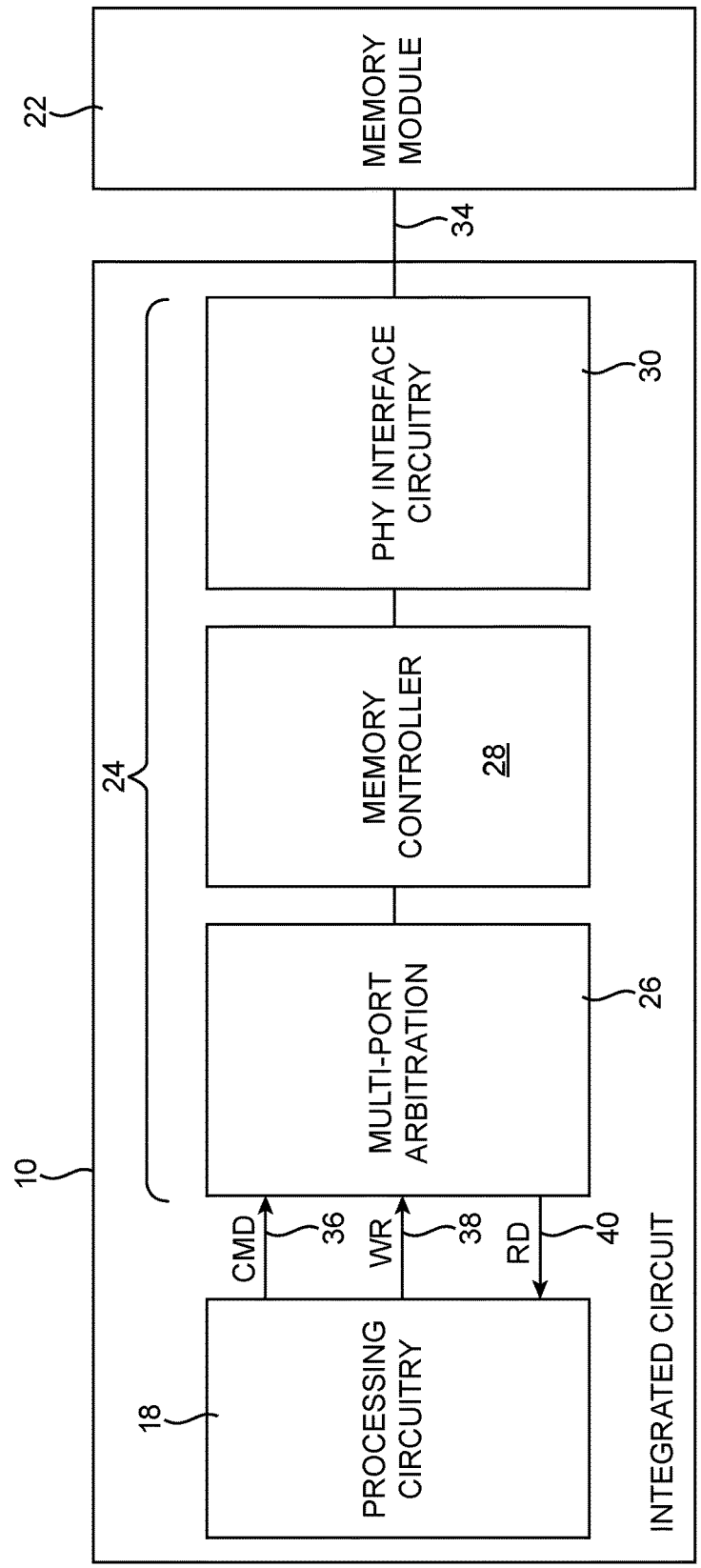
FIG. 1 is a diagram of an illustrative integrated circuit die that includes memory interface circuitry for communicating with external memory in accordance with an embodiment.

FIG. 1 is a diagram of an illustrative integrated circuit die such as integrated circuit device 10. Integrated circuit 10 may include memory interface circuitry for communicating with off-chip memory such as random-access memory (RAM) module 22. Device 10 may be microprocessors, application specific integrated circuits, programmable integrated circuits, or other suitable integrated circuits.

Memory device (sometimes referred to as system memory) 22 may be an external, in-package, or embedded memory device sometimes referred to as a single in-line memory module (SIMM) or a dual in-line memory module (DIMM). Memory module 22 may include volatile memory elements organized into different banks (e.g., bank 0, bank 1, bank, 2, and so on). A "page" may refer to an opened row in a particular bank of memory.

The different memory banks can also be grouped into one or more ranks. Device 10 may be configured to communicate with at least two memory modules 22, at least four memory modules 22, etc.

As shown in FIG. 1, device 10 may include memory interface and control circuitry 24 that serves to relay information between memory module 22 and user logic circuits 18 that are internal to device 10. User logic 18 may sometimes be referred to as storage and processing circuitry, which may include embedded microprocessors, digital signal processors (DSP), microcontrollers, specialized processing blocks, arithmetic processing circuits, or other processing circuitry. Circuitry 18 may further have random-access memory (RAM), first-in first-out (FIFO) circuitry, stack or last-in first-out (LIFO) circuitry, read-only memory (ROM), content-addressable memory (CAM), or other memory elements.

Memory interface circuitry 24 may include a multi-port arbitration circuit 26, a memory controller such as memory controller 28, and PHY interface circuitry 30. The PHY interface 30 may serve as a physical layer input-output device (i.e., a component that physically drives signals off of device 10 to memory module 22 and receives signals from memory module 22). Multi-port arbitration circuit 26 may be used to interface with processing logic 18 to help handle memory access commands from different ports. For example, arbitration circuit 26 may directly receive from processing circuitry 18 memory access commands via path 36 from multiple client ports. Depending on the type of commands being issued, arbitration circuit 26 may either prioritize read commands over write commands, write commands over read commands, or simply prioritize memory access commands from a one port over another (as examples).

During memory write operations, processing logic 18 may provide write data signals to arbitration circuit 26 via path 38. The write data (WR) signals and associated data strobe, clock, address, and/or other control signals may be passed through to and processed by memory controller 28 and output to memory module 22 via PHY interface 30 over path 34. The address signals may serve to specify the address (e.g., a selected bank address in memory device 22) to which data is written during write operations and the address from which data is read out during read operations. During memory read operations, data retrieved from memory module 22 may be conveyed from memory module 22 to PHY interface 30 via path 34. Memory controller 28 may process the read back and may forward the read data (RD) to core logic 18 via arbitration circuit 26 over return path 40.

Memory interface and control circuitry 24 may also serve to perform desired data rate conversions and to generate signals that meet timing requirements specified by the memory protocol currently under use. The arrangement of FIG. 1 is merely illustrative and is not intended to limit the scope of the present invention. If desired, memory interface circuitry 24 may be implemented as an external controller to device 10 as a separate standalone memory interface device.

In one conventional memory system, an integrated circuit only includes clients that support out-of-order (OOO) data return. Each client can issue read and write commands with an associated unique transaction ID to help differentiate the commands by client. Since the clients support OOO data return, the clients can consume read data in any receive order. Each client includes its own dedicated data buffer to perform data reordering internally if needed or desired. Configured in this way, no data reordering is required at the memory controller, and the memory controller can return the read data with the associated transaction ID as soon as it is ready for output. While out-of-order scheduling offers optimal read latency and memory interface bandwidth (since read data is not throttled at the memory controller), it is limited by the depth of each client's internal buffer.

In another conventional memory system, an integrated circuit only includes clients that require in-order (IO) data return. In other words, clients can only consume read data in the order that it has been requested. In such systems, the memory controller will include a read data reordering buffer for reordering the read data prior to returning it to the clients. Since the read data reordering buffer within the memory controller has to reorder data for each and every client, the reordering buffer has to be quite deep. If the reordering buffer is ever full, the memory controller will have to throttle command scheduling. As a result, clients in the same system may end up throttling each other due to data reordering needs, thereby degrading read latency.

Figure 2:
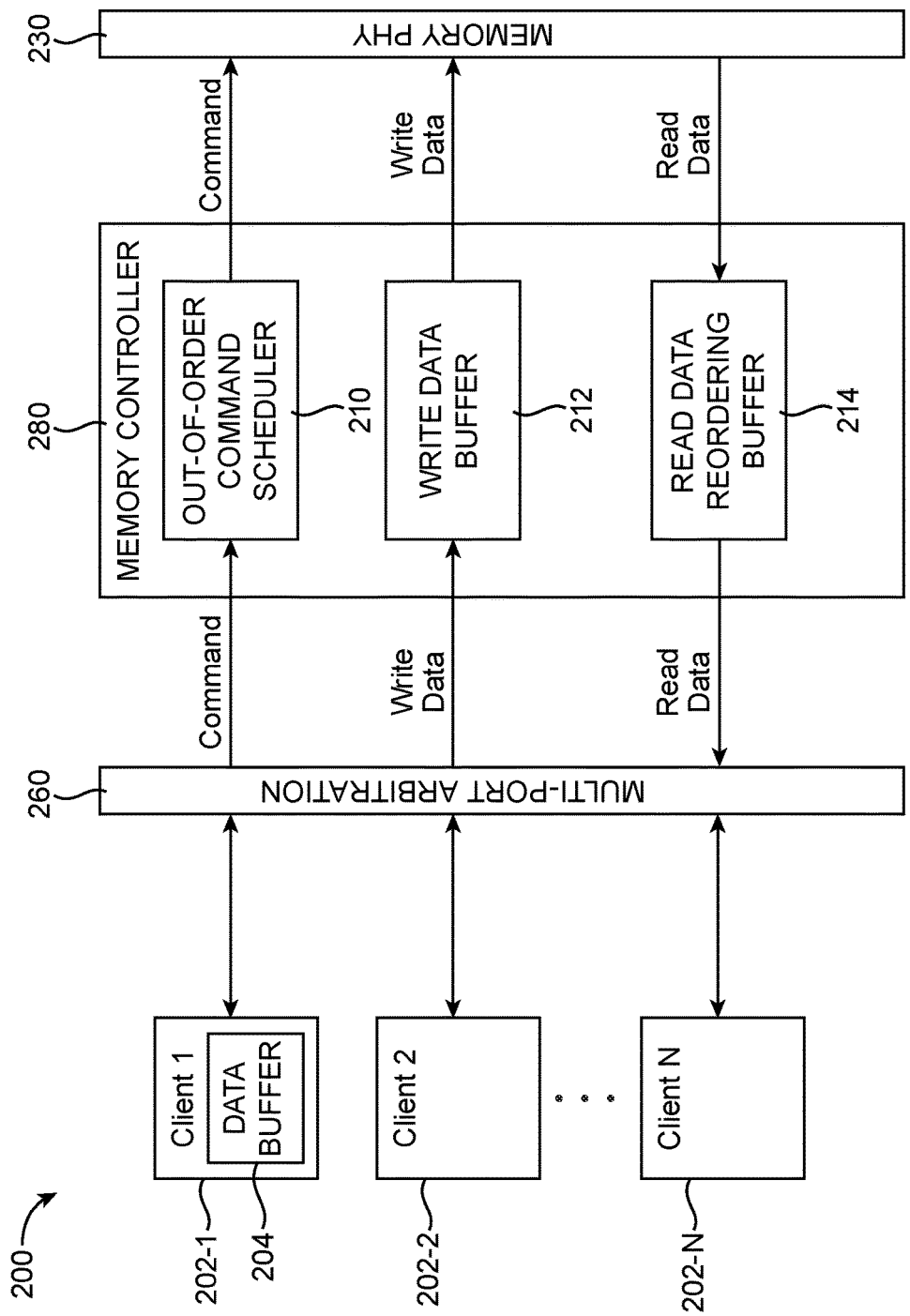
FIG. 2 is a diagram of a mixed in-order and out-of-order memory system that includes a read data reordering buffer within the memory controller.

FIG. 2 is a memory system that includes a mixture of both out-of-order clients and in-order clients (i.e., clients of different scheduling types). As shown in FIG. 2, memory system 200 includes N clients 202 (e.g., clients 202-1, 202-2, . . . , 202-N), memory controller 280, multi-port arbitration circuit 260 coupled between clients 202 and memory controller 280, and physical memory interface 230. In particular, client 202-1 is an out-of-order client (i.e., a client that can support out-of-order command scheduling using its internal data buffer 204), whereas clients 202-2 through 202-N are in-order clients (i.e., clients that lack an internal data reordering buffer and therefore require data to be return in the same order that it is requested). Clients 202 send memory access requests or commands to an out-of-order command scheduler 210 within controller 280 via circuit 260, which then forwards the command out of order to interface 230. Similarly, clients 202 send write data to a write data buffer 212 within controller 280 via circuit 260, which then forwards the write data to interface 230.

In this particular scenario, out-of-order client 202-1 is able to handle read data independent of the order of at which it is requested. The presence of in-order clients 202-2 through 202-N, however, will force read data reordering buffer 214 to be inserted into memory controller 280, which serves to return all read data in the same order that it is requested. This requirement could result in a much deeper read data buffer 214 in order to not starve the out-of-order client 202-1. Configured in the arrangement of FIG. 2, the out-of-order scheduling is still limited by the depth of buffer 214, the out-of-order client is unable to achieve the best efficiency if it has to wait for the in-order clients, and read latency is completely dependent on the memory traffic seen by memory controller 280 and its scheduling policies. It would therefore be desirable to provide improved memory interface circuitry that can support both out-of-order and in-order clients without suffering from reduced read latency and bandwidth.

Figure 3:
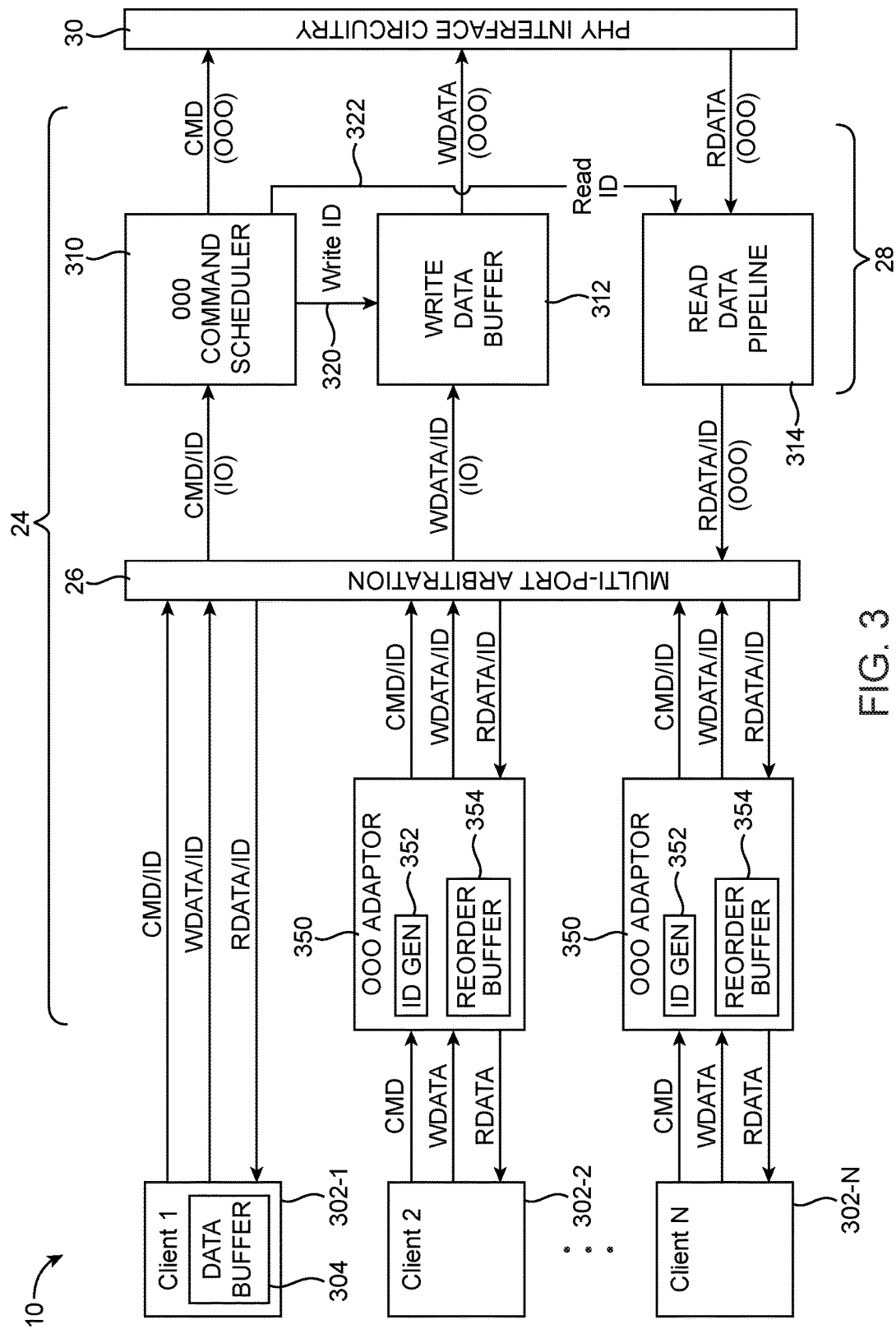
FIG. 3 is a diagram of an illustrative integrated circuit that includes distributed data reordering circuitry that includes out-of-order (OOO) adaptor circuits for each in-order client in accordance with an embodiment.

In accordance with an embodiment, integrated circuit device 10 may be provided with distributed data reordering circuitry such as out-of-order adaptor circuits inserted between each in-order client and the memory controller. FIG. 3 shows how out-of-order adaptor circuits such as OOO adaptor circuits 350 can be inserted between the in-order clients and the multi-port arbitration circuit.

As shown in FIG. 3, device 10 may include N clients 302 (e.g., clients 302-1, 302-2, . . . , 302-N) coupled to multi-port circuit 26 and memory controller 28 (see FIG. 1). In the example of FIG. 3, client 302-1 may be an out-of-order client (i.e., a client that can support out-of-order command scheduling using its internal data buffer 304), whereas clients 302-2 through 302-N may be in-order clients. Clients 302 may send memory access requests or commands to an out-of-order command scheduler 310 within memory controller 28 via circuit 26, which then forwards the command out of order to interface 30. Similarly, clients 302 may send write data to write data buffer 312 within controller 28 via circuit 26, which then forwards the write data to interface 30. The example of FIG. 3 in which there is only one OOO client 302-1 is merely illustrative. In general, device 10 may include any number of OOO clients with any number of IO clients.

In particular, OOO adaptors 350 may be configured to reorder read data locally for the client that it serves. Each adaptor 350 may include an ID generator 352 and reorder buffer 354. The depth of reorder buffer 354 within each adaptor 350 may be sized based on the number of outstanding reads that the corresponding in-order client is capable of handling. For example, if client 302-2 is capable of outputting 16 outstanding read requests, then reorder buffer 354 in the corresponding OOO adaptor 350 should be at least 16 deep. As another example, if client 302-N is capable to generating only 8 outstanding read request, then reorder buffer 354 in the corresponding OOO adaptor 350 can be as small as 8 slots deep. Out-of-order adaptor circuits 350 may sometimes be considered part of memory interface circuitry 24.

The use of OOO adaptors 350 distributed across each of the in-order clients can help obviate the need for a read data reordering buffer at memory controller 28. In FIG. 3, memory controller may include a simple read data pipeline 314 that merely buffers data without any need for reordering. The OOO clients such as client 302-1 may be directly connected to multi-port arbitration circuit 26, which allows uninterrupted access to the memory controller.

Since the data reordering for the in-order clients is no longer performed at memory controller 28 but rather locally at its own OOO adaptor 350, the data reordering of each in-order client does not block other in-order or out-of-order clients. This allows the entire memory system on device 10 to run out-of-order, which offers optimum read latency for both out-of-order clients and in-order clients (e.g., OOO clients see no latency penalty while the in-order clients pay latency for reordering at adaptor 350 within its own memory stream).

As described above, the size of each reordering buffer (i.e., buffer 304 within each OOO client or buffer 354 in each adaptor circuit 350) may be selected based on the needs of each particular client. Arranged in this way, a smaller total reordering buffer capacity can be realized, which helps to reduce resource utilization, power consumption, and potential timing closure issues.

In order to keep track which command is associated with each client, every command is assigned a unique identifier (ID) tag. Memory controller 28 may receive commands from any one of the clients. Upon receiving a command, OOO command scheduler 310 may forward the corresponding write ID to write data buffer 312 via path 320 and the read ID to read data pipeline 314 via path 322. Operated in this way, write data buffer 312 and read data pipeline 314 is able to keep track which piece of data is associated with which command.

Out-of-order clients may be capable of generating its own IDs along with its read and write commands and properly identifying the return data based on the associated ID. In contrast to OOO clients, in-order clients do not have any ID generator nor identification capability. As such, the ID generation and reordering based on the generated ID should be handled entirely within each OOO adaptor 350.

Figure 4:
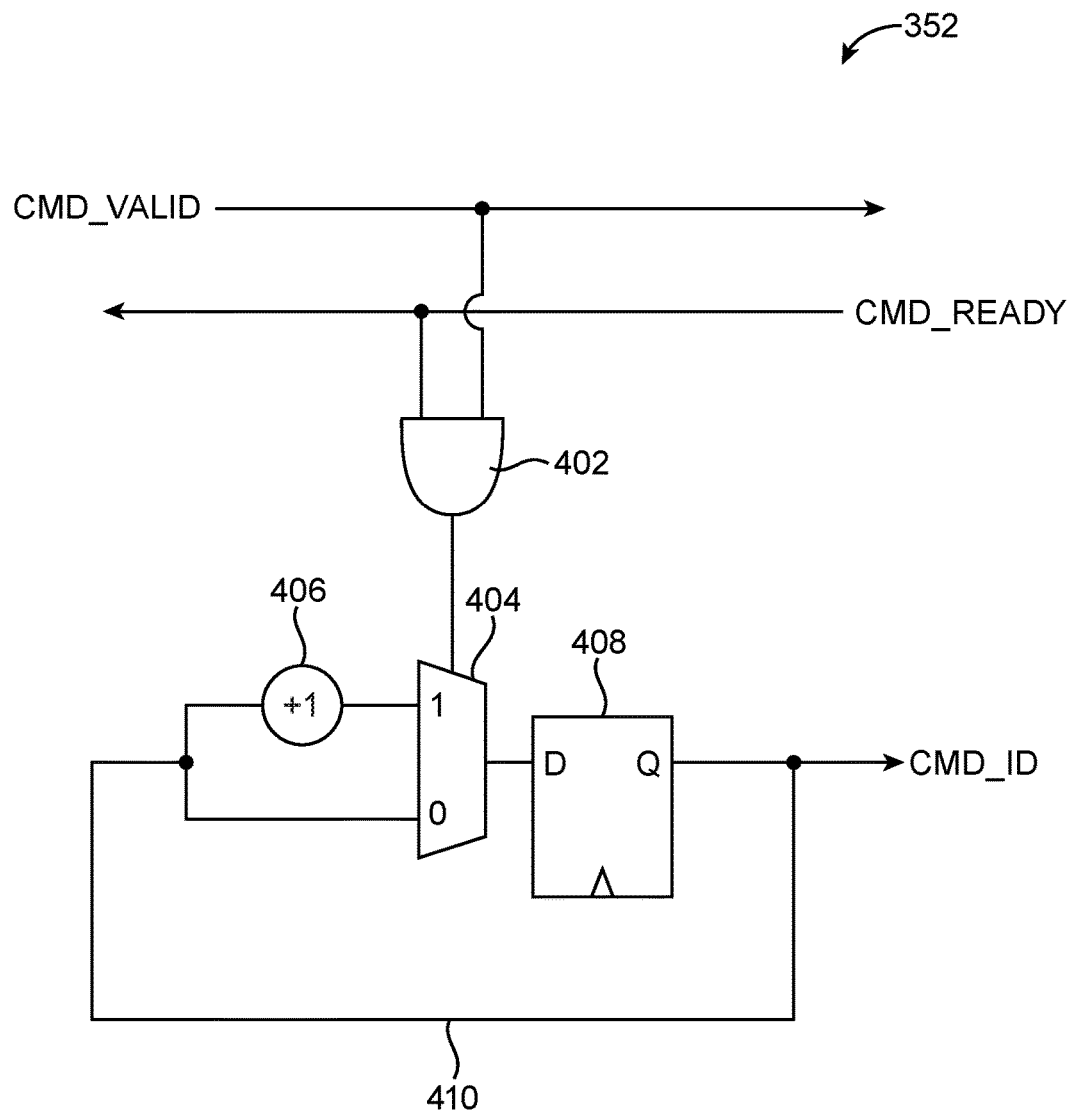
FIG. 4 is a circuit diagram of an illustrative command identifier (ID) generator that can be included within an OOO adaptor circuit of the type shown in FIG. 3 in accordance with an embodiment.

FIG. 4 is a diagram of ID generation circuit 352. As shown in FIG. 4, ID generator 352 may include a logic gate such as logic AND gate 402, a multiplexing circuit such as multiplexer 404, an incrementing circuit 406, and a digital latching circuit such as flip-flop 408. Logic AND gate 402 may receive a command valid signal CMD_VALID (e.g., a valid signal asserted by the in-order client) and a command ready signal CMD_READY (e.g., a ready signal asserted by arbitration circuit 26 or controller 28). The command valid and ready signals serve collectively as handshake signals to let the in-order client know when a transaction is ready to be processed by multi-port arbitration circuit 26 and/or memory controller 28.

Logic AND gate 402 has an output that is connected to the control input of multiplexer 404. Multiplexer 404 has an output that is connected to the data input (D) of flip-flop 408. Flip-flop 408 has a data output (Q) at which a current command ID tag CMD_ID is provided. Moreover, multiplexer 404 may have a first (0) data input that is connected to the output of flip-flop 408 as indicated by feedback path 410, and a second (1) data input that receives an incremented version of tag CMD_ID via incrementing circuit 406. Configured in this way, ID generator 352 serves as an incrementor that monotonically increments signal CMD_ID after each successful command transfer (i.e., when both CMD_VALID and CMD_READY are asserted). A local command ID generated using this approach can help keep track of the order of the memory access requests.

Figure 5:
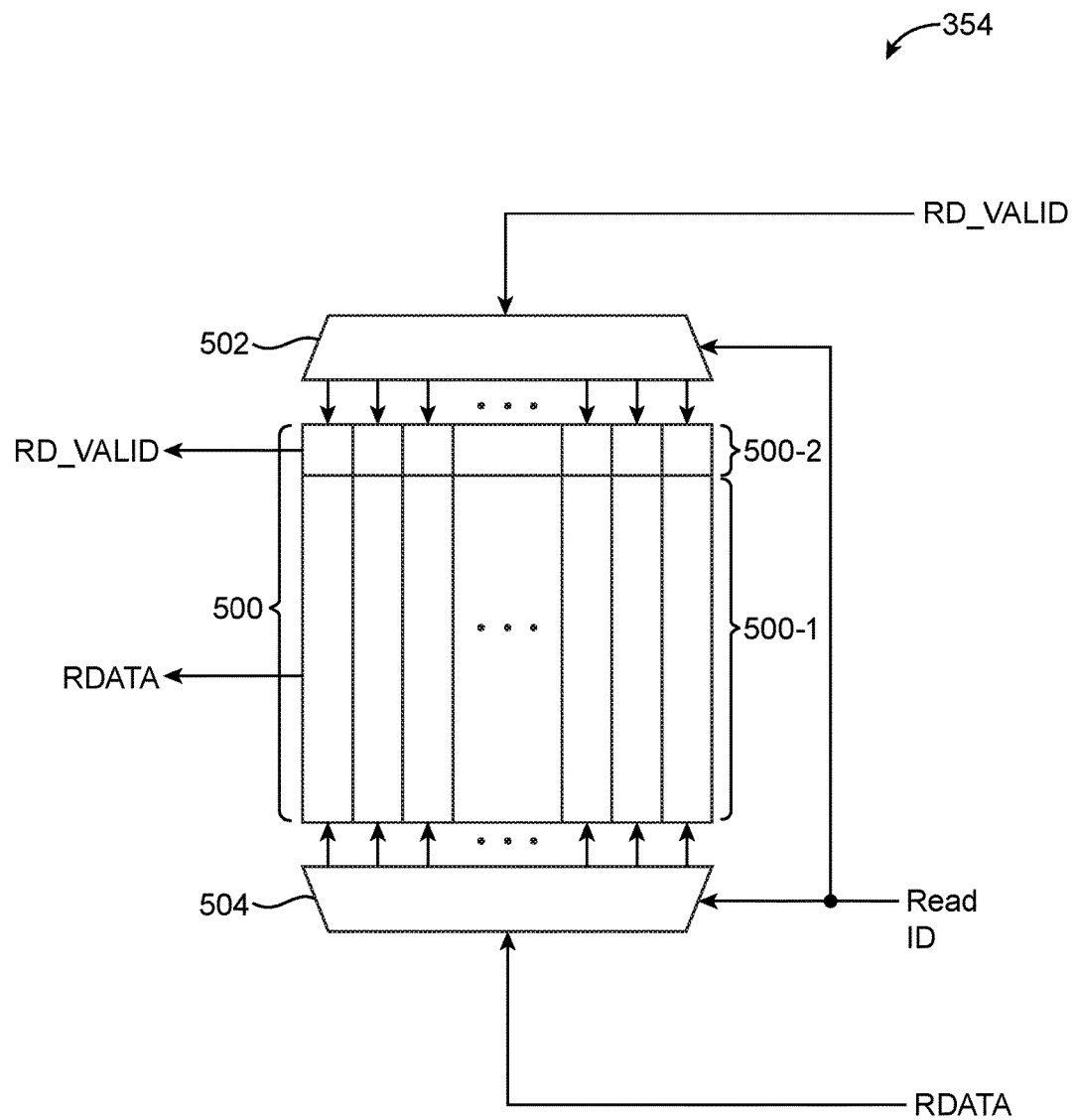
FIG. 5 is a circuit diagram of an illustrative reordering buffer that can be included within an OOO adaptor circuit of the type shown in FIG. 3 in accordance with an embodiment.

FIG. 5 is a diagram of reorder buffer 354. As shown in FIG. 5, reorder buffer 354 may include a storage circuit 500 having a first portion 500-1 for actually storing the read data (RDATA) and a second portion 500-2 for storing the read valid flag (RD_VALID). A first decoding circuit 502 may receive an incoming read valid signal and store that read valid signal into a corresponding entry in portion 500-2 based on the received read ID. A second decoding circuit 504 may receive incoming read data and store that read data into a corresponding entry in portion 500-1 also based on the received read ID. Operated in this way, the read ID tag serves to decode the target data buffer entry. The read ID is passed through the entire system and returned by memory controller 28 with the associated read data. The read ID may be equivalent to the command ID tag.

Storage circuit 500 may also be addressed using a head-of-queue pointer. The head-of-queue pointer may start at the first entry and march through each successive entry one-by-one before cycling back to the first entry in circuit 500. As described above, the depth of buffer 354 is a function of the number of outstanding commands at the in-order client to ensure that commands are never throttled due to insufficient reorder buffer entries. Read data and its corresponding valid flag may populate storage circuit 500 in any order. However, read data will only be drained from circuit 354 when the head-of-queue pointer has its valid indication bit asserted (i.e., if the head of queue is pointing to an entry where the RD_VALID is also high). Configured in this way, read data throttling will only occur for the local client using reordering buffer 354 within OOO adaptor 350.

Figure 6:
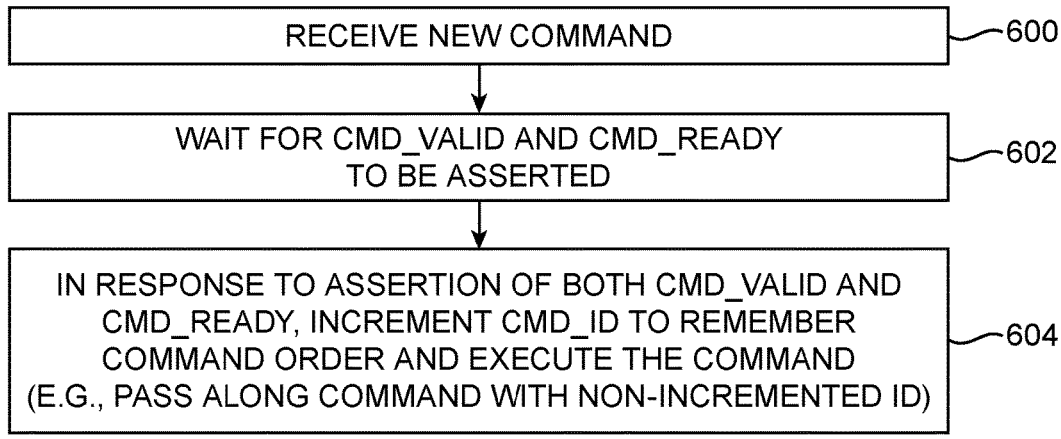
FIG. 6 is a flow chart of illustrative steps for operating the ID generator of FIG. 4 in accordance with an embodiment.

FIG. 6 is a flow chart of illustrative steps for operating ID generator 352. At step 600, out-of-order adaptor 350 may be ready to receive a new command from the in-order client. At step 602, ID generator 352 may wait for both signals CMD_VALID and CMD_READY to be asserted. In response to assertion of both signals CMD_VALID and CMD_READY, generator 352 may output its current CMD_ID and increment the CMD_ID for the next command to remember the command order (step 604). At this point, OOO adaptor 350 may also pass the command along with the pre-incremented ID to arbitration circuit 26.

Figure 7:
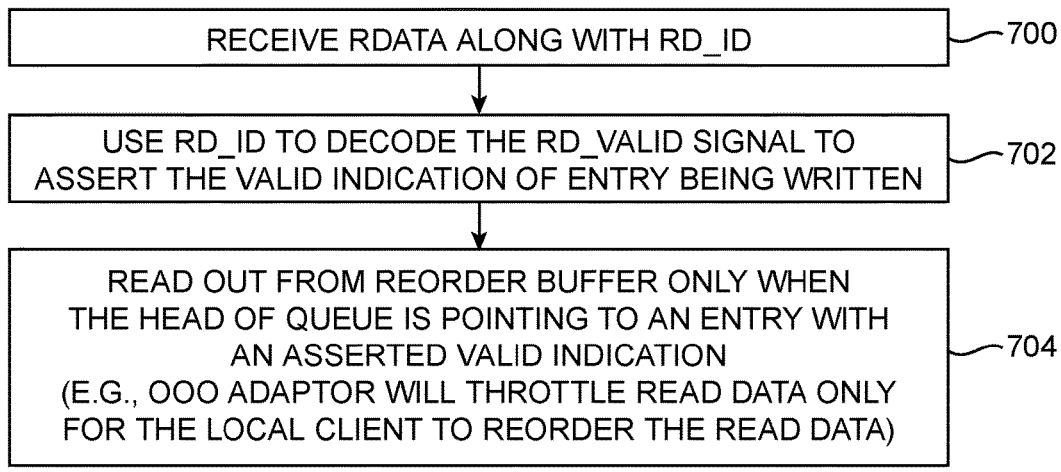
FIG. 7 is a flow chart of illustrative steps for operating the reordering buffer of FIG. 5 in accordance with an embodiment.

FIG. 7 is a flow chart of illustrative steps for operating reordering buffer 354. At step 700, reordering buffer 354 may receive the read data RDATA along with its read ID tag RD_ID. At step 702, value RD_ID may be used to decode circuit 504 to determine where RD_DATA will be written and also to decode circuit 502 to determine which read valid indication flag to assert.

At step 704, data will be read out for reorder buffer 354 only when the head-of-queue pointer is point to an entry with an asserted read valid indication flag (e.g., OOO adaptor 350 will throttle read data until the next expected read data is ready to be output to the client).

These steps are merely illustrative. The existing steps may be modified or omitted; some of the steps may be performed in parallel; additional steps may be added; and the order of certain steps may be reversed or altered.

The foregoing is merely illustrative of the principles of this invention and various modifications can be made by those skilled in the art. The foregoing embodiments may be implemented individually or in any combination.

What is claimed is:

1. An integrated circuit, comprising:
   a first client of a first scheduling type;
   a second client of a second scheduling type that is different than the first scheduling type;
   a memory controller; and
   an out-of-order adaptor circuit that is only interposed between the second client and the memory controller and that performs read data reordering for the second client, wherein the out-of-order adaptor circuit is separate from the second client.

2. The integrated circuit of claim 1, wherein the first client comprises an out-of-order client that includes an internal data reordering buffer.

3. The integrated circuit of claim 1, wherein the second client comprises an in-order client that requires read data to be returned in the same order that is requested by the second client.

4. The integrated circuit of claim 1, further comprising:
   a multi-port arbitration circuit that is interposed between the memory controller and the out-of-order adaptor circuit.

5. The integrated circuit of claim 4, wherein the first client is directly connected to the multi-port arbitration circuit.

6. The integrated circuit of claim 1, wherein the memory controller includes an out-of-order command scheduler and a simple read data pipeline that does not perform data reordering.

7. The integrated circuit of claim 1, wherein the out-of-order adaptor circuit comprises a command identifier (ID) generator.

8. The integrated circuit of claim 7, wherein the command identifier generator comprises an incrementing circuit.

9. The integrated circuit of claim 1, wherein the out-of-order adaptor circuit comprises a reordering buffer.

10. The integrated circuit of claim 9, wherein the reordering buffer has a first portion for storing read data and a second portion for storing a read valid flag, and wherein the first and second portions are addressed using a read ID tag.

11. A method for operating an integrated circuit, comprising:
    issuing a first command from a first client of a first scheduling type;
    issuing a second command from a second client of a second scheduling type;
    receiving the second command from the second client at an out-of-order adaptor circuit; and
    with a memory controller, receiving the first command from the first client and the second command from the out-of-order adaptor circuit.

12. The method of claim 11, further comprising:
    performing read data reordering internally within the first client using a data reordering buffer within the first client.

13. The method of claim 11, wherein the integrated circuit further includes a multiport arbitration circuit interposed between the memory controller and the first and second clients, the method further comprising:
    with the multiport arbitration circuit, receiving the first command directly from the first client and receiving the second command directly from the out-of-order adaptor circuit.

14. The method of claim 11, wherein the out-of-order adaptor circuit includes an identifier (ID) generator, the method further comprising:
    with the ID generator, receiving a command valid signal and a command ready signal; and
    in response detecting that the received command valid signal and the received command ready signal are both asserted, outputting a command ID tag and then incrementing the command ID tag for the next command.

15. The method of claim 11, wherein the out-of-order adaptor circuit includes a read data reordering buffer, the method further comprising:
    with the read data reordering buffer, receiving read data and a read identifier (ID) tag;
    storing the read data into a first portion of the read data reordering buffer by addressing the read data reordering buffer with the read ID tag;
    asserting a corresponding read valid flag in a second portion of the read data reordering buffer; and
    outputting data from the read data reordering buffer only when a head-of-queue pointer is pointing to an entry in the read data reordering buffer with an asserted read valid flag.

16. Memory interface circuitry on an integrated circuit, comprising:
    a client that issues a memory access command;
    an out-of-order adaptor that receives the memory access command from the client;
    a memory controller that receives the memory access command from the out-of-order adaptor, wherein the memory controller does not include any data reordering circuitry; and
    a memory arbitration circuit coupled between the memory controller and the out-of-order adaptor.

17. The memory interface circuitry of claim 16, further comprising:
    an additional client that receives read data out of order from the memory controller.

18. The memory interface circuitry of claim 17, wherein the memory arbitration circuit is directly connected to the additional client.

19. The memory interface circuitry of claim 17, wherein the additional client has an internal data buffer, wherein the out-of-order adaptor has a reordering buffer, and wherein the internal data buffer in the additional client and the reordering buffer in the out-of-order adaptor have different memory capacities.

20. The memory interface circuitry of claim 16, further comprising:
   an additional client that issues memory access commands; and
   an additional out-of-order adaptor that receives the memory access commands from the additional client, wherein the out-of-order adaptor has a first reorder buffer of a first size, and wherein the additional out-of-order adaptor has a second reorder buffer of a second size that is different than the first size.

* * * * *